(12) United States Patent
Lin et al.

(10) Patent No.: US 8,854,233 B2
(45) Date of Patent: Oct. 7, 2014

(54) METHOD AND SYSTEM FOR DE-BINARIZATION

(71) Applicant: Mediatek Inc., Hsin-Chu (TW)

(72) Inventors: Ting-An Lin, Hsinchu (TW); Han-Liang Chou, Hsinchu (TW); Kun-Bin Lee, Taipei (TW); Yi-Hau Chen, Taipei (TW); Chi-Cheng Ju, Hsinchu (TW); Yen-Chieh Lai, Taipei (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/784,786

(22) Filed: Mar. 4, 2013

(65) Prior Publication Data

US 2014/0247165 A1     Sep. 4, 2014

(51) Int. Cl.
*H03M 7/00* (2006.01)
*H03M 7/40* (2006.01)
*H03M 7/30* (2006.01)

(52) U.S. Cl.
CPC . *H03M 7/00* (2013.01); *H03M 7/40* (2013.01); *H03M 7/4006* (2013.01); *H03M 7/30* (2013.01)
USPC ............................................. 341/50; 341/107

(58) Field of Classification Search
CPC ........ H03M 7/30; H03M 7/40; H03M 7/4006
USPC ................................ 341/50, 51, 67, 106, 107
See application file for complete search history.

(56) References Cited

U.S. PATENT DOCUMENTS 6,982,663 B2 *  1/2006  Winger .......................... 341/107

* cited by examiner

*Primary Examiner* — Joseph Lauture
(74) *Attorney, Agent, or Firm* — Winston Hsu; Scott Margo

(57) ABSTRACT

A method for generating a decoded value from a codeword which is binarized utilizing a concatenated unary/k-th order Exp-Golomb code includes: identifying a first portion of the codeword, a second portion of the codeword and a third portion of the codeword; generating an offset according to the second portion; decoding the third portion to generate an index value; and generating the decoded value by adding the offset and the index value.

20 Claims, 3 Drawing Sheets

FIG. 1 RELATED ART

| abs_level | 1st portion — TU prefix | | | | | | | | | | | | | | 2nd and 3rd portion — EG suffix | | | | |
|---|---|---|---|---|---|---|---|---|---|---|---|---|---|---|---|---|---|---|---|
| bin | 1 | 2 | 3 | 4 | 5 | 6 | 7 | 8 | 9 | 10 | 11 | 12 | 13 | 14 | 15 | 16 | 17 | 18 | 19 |
| 1  (Type 1) | 0 | | | | | | | | | | | | | | | | | | |
| 2  | 1 | 0 | | | | | | | | | | | | | | | | | |
| 3  | 1 | 1 | 0 | | | | | | | | | | | | | | | | |
| 4  | 1 | 1 | 1 | 0 | | | | | | | | | | | | | | | |
| 5  | 1 | 1 | 1 | 1 | 0 | | | | | | | | | | | | | | |
| ⋮ | ⋮ | ⋮ | ⋮ | ⋮ | ⋮ | ⋮ | ⋮ | ⋮ | ⋮ | ⋮ | ⋮ | ⋮ | | | | | | | |
| 13 | 1 | 1 | 1 | 1 | 1 | 1 | 1 | 1 | 1 | 1 | 1 | 1 | 0 | | | | | | |
| 14 | 1 | 1 | 1 | 1 | 1 | 1 | 1 | 1 | 1 | 1 | 1 | 1 | 1 | 0 | | | | | |
| 15 (Type 2) | 1 | 1 | 1 | 1 | 1 | 1 | 1 | 1 | 1 | 1 | 1 | 1 | 1 | 1 | 0 | | | | |
| 16 | 1 | 1 | 1 | 1 | 1 | 1 | 1 | 1 | 1 | 1 | 1 | 1 | 1 | 1 | 1 | 0 | 0 | | |
| 17 | 1 | 1 | 1 | 1 | 1 | 1 | 1 | 1 | 1 | 1 | 1 | 1 | 1 | 1 | 1 | 0 | 1 | | |
| 18 | 1 | 1 | 1 | 1 | 1 | 1 | 1 | 1 | 1 | 1 | 1 | 1 | 1 | 1 | 1 | 1 | 0 | 0 | 0 |
| 19 | 1 | 1 | 1 | 1 | 1 | 1 | 1 | 1 | 1 | 1 | 1 | 1 | 1 | 1 | 1 | 1 | 0 | 0 | 1 |
| 20 | 1 | 1 | 1 | 1 | 1 | 1 | 1 | 1 | 1 | 1 | 1 | 1 | 1 | 1 | 1 | 1 | 0 | 1 | 0 |
| ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ |

METHOD AND SYSTEM FOR DE-BINARIZATION

BACKGROUND

Video coding is an essential technology, used in applications from digital televisions to video streaming. H.264 is a standard that was first proposed in 2003, and evolved to transmit high quality, high definition video at low bit rates. Its high performance and adaptability for many applications has placed it at the forefront of current coding technology.

H.264 is able to perform almost lossless compression by taking advantage of Variable Length Coding (VLC) and Context Adaptive Binary Arithmetic Coding (CABAC) which can render information digitally at low bit rates. CABAC transforms data into bits, encodes them as binary symbols, and applies multiple probability models to the binary symbols which are selected adaptively. A number of binarization techniques can be used. Unary binarization is a technique which converts a codeword into a string of ONES followed by a terminating ZERO. Alternatively, Unary binarization technique can be a processing which converts a codeword into a string of ZEROS followed by a terminating ONE. This has the advantage of making each codeword uniquely distinguishable but larger codewords will be very long, as the number of bins depends on the size of the largest value. An alternative binarization method is Exponential-Golomb (exp-Golomb) binarization wherein a codeword is split into a unary prefix and a binary suffix. This form of binarization reduces the number of bins which need to be sent through a binary arithmetic coder (BAC), but has the disadvantage of being unable to quickly distinguish between smaller and larger codewords.

A concatenated unary/k-th order Exp-Golomb code (UEGK) has therefore been developed for H.264, which combines the advantages of both unary and Exp-Golomb binarization methods. Below a certain threshold, a bin string for a codeword N is formed by a unary code consisting of a series of N−1 ONES terminated with a ZERO. At and above the threshold, a bin string is formed by a truncated unary prefix consisting of a series of ONES and followed by a k-th order Exp-Golomb suffix. The prefix is made up of a first portion of a bin string. The suffix is made up of a second portion and a third portion, where the second portion is a series of ONES terminated with a ZERO, and the third portion is a binary value consisting of a number of bits. For k-th order Exp-Golomb suffix, if the number of ONES in second pattern is P, then the binary value in third portion consists of (P+k) bits.

Please refer to FIG. 1, which illustrates an UEG0 bin string table for a UEGK of 0-th order code used for the syntax element coeff_abs_level_minus1 (i.e., |transform coefficient level|−1; the "abs_level" shown in the figure is equal to coeff_abs_level_minus1+1) in H.264 and MPEG-4. As shown in the table, the threshold at which the codewords will be formed with a suffix is 15. In other words, when N (abs_level) is less than 15, the codewords will be formed by a unary code consisting of a series of N−1 ONES terminated with a ZERO, and when N is greater than or equal to 15, the codewords will be formed by a truncated unary prefix (first portion) with an Exp-Golomb (EG) suffix consisting a second portion and a third portion. The codewords can therefore be divided into Type 1 codewords (N is less than 15) and Type 2 codewords (N is greater than or equal to 15).

A conventional method of de-binarizing a bin string coded with the UEGk binarization scheme is to decode each portion of the codeword separately, thereby obtaining three respective index values, and then adding all three index values together. An example of this is described herein. When a codeword is Type 2, the first portion has a defined number of ONES which enables the first index value to be directly derived. The number of ONES in the second portion can be counted to derive the second index value. The number of ONES in the second portion also indicates how many bits make up the third portion, for example, the number of ONES in the second portion is the same as the number of bits in the third portion in UEG0 (Unary $0^{th}$ order Exp-Golomb code) bin strings. These bits of third portion will then be used to derive the third index value. The value of the syntax element represented by the UEGK bin string can be calculated by summing the first index value, second index value, and the third index value.

As the conventional method typically requires two adders for decoding the codewords, a certain amount of hardware is required. This may have a negative effect on the timing path in hardware design. It is therefore an objective of the present invention to provide a simpler and more efficient method of decoding codewords which are binarized using a UEGK scheme.

SUMMARY

A method for generating a decoded value from a codeword which is binarized utilizing a concatenated unary/k-th order Exp-Golomb code comprises: identifying a first portion of the codeword, a second portion of the codeword and a third portion of the codeword; generating an offset according to the second portion only; decoding the third portion to generate an index value; and generating the decoded value by adding the index value to the offset. In an embodiment, the offset is determined by deriving the number of successive bit ONES of the second portion; and using the derived number as the input of a look-up table. The offset is the output of the look-up table. Alternatively, the offset is derived by left shifting value 1 according to the number of bits in the second portion (e.g., 1<<(P+k), where P is number of successive bit ONES of the second portion, k is the order of UEGK) and adding the left shifted resultant to a predetermined value. The first portion of the codeword corresponds to a truncated unary prefix of the codeword, and the second and third portions of the codeword correspond to an Exp-Colomb suffix of the codeword.

A method for generating a decoded value from a codeword which is binarized utilizing a concatenated unary/k-th order Exp-Golomb code comprises: identifying a first portion of the codeword, a second portion of the codeword and a third portion of the codeword; generating an offset by performing logic operations on the second portion and the third portion; and adding a predefined value to the offset to generate the decoded value. The offset can be generated from deriving the number of successive bit ONES of the second portion; deriving a binary value of the third portion; converting the derived number into another binary value and performing a bitwise OR on the two binary values, or concatenating one bit ONE in front of the most significant bit (MSB) of the binary value derived from the third portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 is a diagram illustrating a UEG0 codeword table.

DETAILED DESCRIPTION

The present invention provides two exemplary methods for decoding codewords which are binarized using a UEGK scheme. Both methods provide more efficient decoding techniques by removing the need for certain hardware components and thereby improve the timing of the coding operation. The present invention can be implemented by hardware, software, or hybrid of hardware and software. When implemented by software, the proposed methods improve performance due to fewer operations and predetermined constant values (i.e., no need to generate these values during the decoding).

Figure 2:
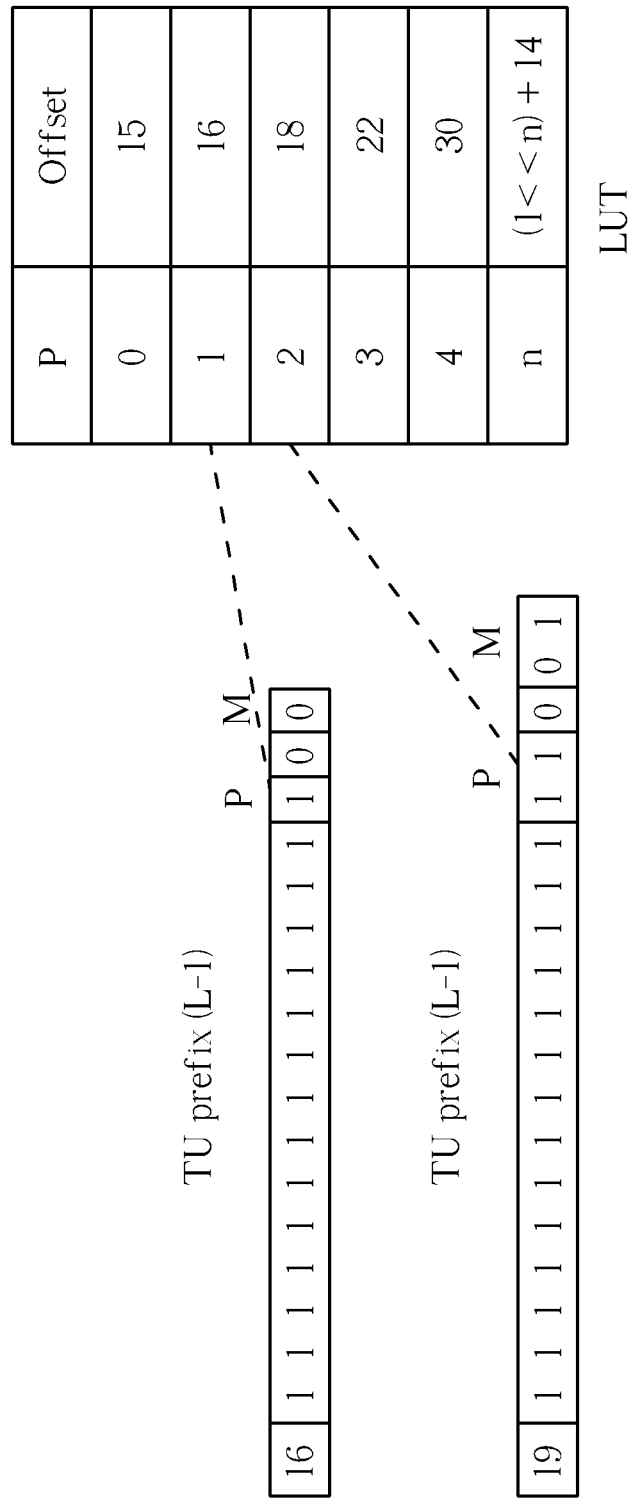
FIG. 2 is a diagram of a look-up table (LUT) according to a first exemplary embodiment of the present invention.

A first exemplary method will be detailed herein, with reference to FIG. 2. An UEG0 codeword belonging to type 2 codeword is composed of a first portion corresponding to a truncated unary prefix, and a second portion and a third portion corresponding to a 0-th order Exp-Golomb suffix. This method replaces an adder for adding a first index value coded by the first portion (the truncated unary prefix) and a second index value coded by the second portion (the first portion of the Exp-Golomb suffix) with a look-up table. As detailed in the background section, for each Type 2 codeword, a number of ONES in the first portion will be the same. Rather than separately decoding the first portion and the second portion, the first exemplary method initially determines a number of ONES in the second portion and then uses this value (symbolized as P in FIG. 2) as an input to the look-up table (LUT).

A number of ONES in the second portion are derived and input to the LUT as the parameter P. The LUT then maps this parameter P to an offset, which can also be determined by the equation $(1<<P)+14$ in this example. The number 14 is derived from a threshold minus one (the threshold is 15 as illustrated in FIG. 1 for determining whether codewords are binarized as Type 1 or Type 2 codewords).

As described above, in UEG0 codeword, the value P also represents the number of bits which make up the third portion M. By an embodiment of the proposed invention, a third index value can be derived by directly treating the third portion as a binary value. The third index value can then be added to the offset derived from the LUT using a single adder to obtain the final decoded value. The use of a LUT and a single adder provides better timing than the conventional hardware design with two adders. In another embodiment, the second portion can be used as the input of a LUT, and the LUT outputs an offset according to the second portion. The offset is then added to the third index value decoded from the third portion to obtain the final decoded value.

Figure 3:
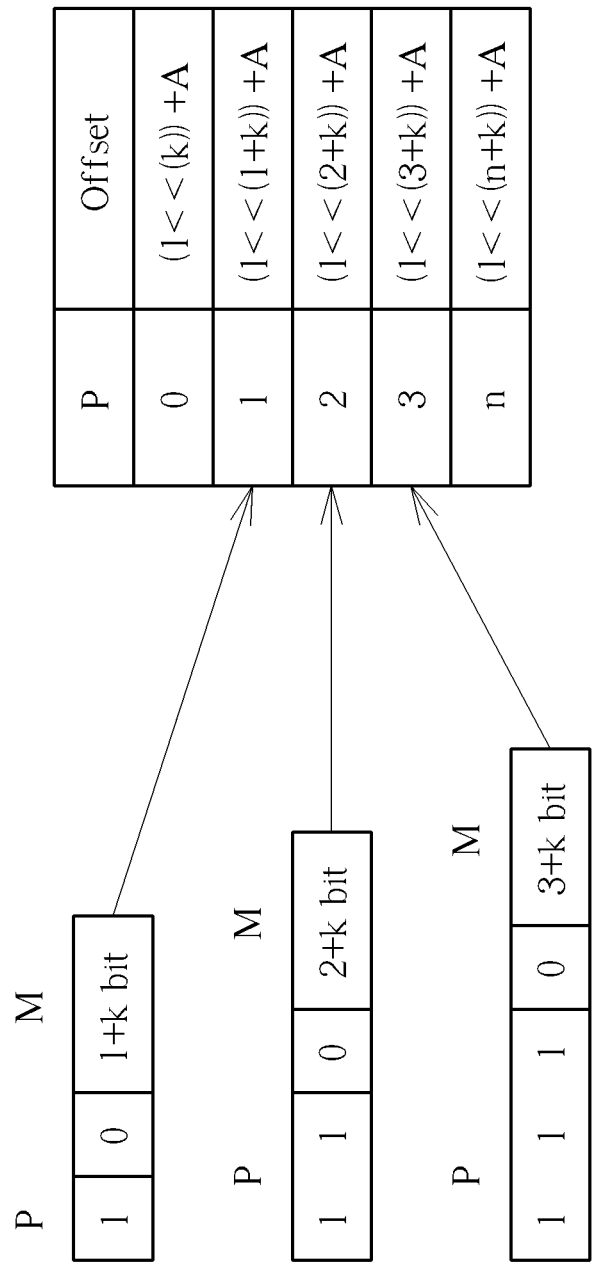
FIG. 3 is a diagram illustrating UEGK for K!=0.

FIG. 3 shows a similar approach when decoding a UEGK codeword. When the number of ONES in the second portion is equal to P, the corresponding binary bit of the third portion M is (P+k), where k is the order of the Exp-Golomb code. The number of ONES in the second portion P can be the input of a LUT, and the LUT maps the input P to an offset value $(1<<(P+k))+A$, where A is a predetermined value. The offset is then added to the third index value decoded from the third portion to obtain the final decoded value.

A second exemplary method replaces an adder for adding the second index value coded by the second portion and the third index value coded by the third portion by performing a logical concatenation operation which only requires simple wire concatenation for the hardware implementation. Please refer to FIG. 1. As before, the number of ONES in the second portion of a Type 2 codeword will be detected. The number of ONES (P) is equivalent to a number of bits which make up the third portion for UEG0 codeword. These bits can therefore be directly looked up. Rather than separately deriving the second index value from P, and deriving the third index value by using an exp-Golomb binarization decoding process, a simple bitwise logic OR/concatenation can be performed to derive a value equivalent to the sum of the second index value and third index value.

$$\text{offset} = ((1<<P)|M)-1$$

where M=third portion with P binary bits, and offset is equivalent to the sum of the second index value and the third index value.

This offset value will then be added to the first index value. As mentioned above, the first index value will be the same for all Type 2 codewords, and can be represented by a constant L. L is equal to 15 in this case shown in FIG. 1. The final de-binarization result is then derived as:

$$\text{Decoded value} = ((1<<P)|M)-1+L.$$

The decoded value can be further expressed as $$\text{Decoded value} = ((1<<P)|M)+(L-1).$$

The minus 1 operation in the above equation can be merged with the calculation of the first index value, i.e. L−1, which can be pre-calculated. Therefore, (L−1) can be treated as a constant value during the processing. A number of examples will be provided to clearly illustrate the above method.

Looking at FIG. 2, in order to decode index value 16 represented by the codeword, the number of ONES (P) in the second portion will be derived. As illustrated in FIG. 1, when P=1, the third portion of the UEG0 codeword is made up of one bit. This bit in the third portion, M, is ZERO. Performing the shift operation as detailed in the above:

$$1<<P = 1<<1 = 2^1 = 2$$

Putting 2 into binary form gives '10'.
Replacing the last bit of the above with M (0) gives '10'.
Converting back from binary, '10' this value=2.

$$\text{Decoded value} = ((1<<P)|M)-1+L = 2-1+15 = 16.$$

Looking again at FIG. 1 and FIG. 2, to decode a codeword representing the index value 19, the number of ONES in the second portion (P) is counted. As illustrated in FIG. 2, P=2. Therefore, the third portion is made up of two bits. These two bits in the third portion, M, are '01'. Performing the shift operation on P as above:

$$1<<2 = 2^2 = 4$$

Putting 4 into binary form gives '100'.
Replacing the last two bits of the above with M gives '101'. The aforementioned operations can be represented as logic operations:

$$((1<<P)|M) = (100|01)$$
$$= 101$$

or the concatenating operation:

$$\{1, M\} = \{1, 01\}$$
$$= 101$$

Converting the bit string '101' back from binary, this value=5.

$$\text{Decoded value} = ((1<<P)|M)-1+L = 5-1+15 = 19.$$

In a modification of the second exemplary method, the number of ONES in the second portion can be determined by many methods, such as directly inputting the second portion to a look-up table or using leading zero detection. Similarly, the binary value of the third portion can be determined by directly inputting the third portion to a look-up table.

Replacing the adder for adding the second and third index values coded by the EG suffix with the above logic operations or concatenation operation can reduce the overall cost as well as providing better timing with respect to the conventional art. The use of look-up tables can also simplify various computation operations which are required for decoding the codewords.

In summary, the present invention provides two exemplary methods for decoding a codeword using a concatenated unary/k-th order Exp-Golomb coding scheme, that can replace traditional hardware implementations with simple logical operations and table look-up methods. Hardware costs can therefore be reduced while timing of the decoding operation is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for generating a decoded value from a codeword which is binarized utilizing a concatenated unary/k-th order Exp-Golomb code, the method comprising:
   identifying a first portion of the codeword, a second portion of the codeword and a third portion of the codeword;
   generating an offset according to the second portion only;
   decoding the third portion to generate an index value; and
   generating the decoded value by adding the offset and the index value.

2. The method of claim 1, wherein the third portion comprises a binary number, and decoding the third portion comprises converting the binary number into the index value.

3. The method of claim 1, wherein the step of generating the offset comprises:
   deriving the number of successive bit ONES in the second portion; and
   using the derived number as the input of a look-up table, wherein the offset is the output of the look-up table.

4. The method of claim 3, wherein the step of generating the offset comprises left shifting value 1 according to the number of successive bit ONES in the second portion and adding the left shifted resultant to a predetermined value.

5. The method of claim 4, wherein the predetermined value is predetermined to indicate a value represented by the truncated unary prefix of the codeword.

6. The method of claim 3, wherein the step of generating the offset comprises left shifting value 1 according to the number of successive bit ONES in the second portion and the order of Exp-Golomb when the order is not zero; and
   adding the left shifted resultant to a predetermined value.

7. The method of claim 1, wherein the step of generating the offset comprises:
   using the second portion as the input of a look-up table to get the output of the look-up table as the offset.

8. The method of claim 1, wherein the first portion of the codeword corresponds to a truncated unary prefix of the codeword which comprises a plurality of bits having the same polarity; and the second and third portions of the codeword correspond to a k-th order Exp-Golomb suffix of the codeword.

9. A method for generating a decoded value from a codeword which is binarized utilizing a concatenated unary/k-th order Exp-Golomb code, the method comprising:
   identifying a first portion of the codeword, a second portion of the codeword and a third portion of the codeword;
   generating an offset based on the second portion and the third portion by performing a logical concatenation operation; and
   adding a predefined value to the offset to generate the decoded value.

10. The method of claim 9, wherein the step of generating the offset comprises:
    left shifting value 1 according to the number of successive bit ONES of the second portion;
    deriving a binary value of the third portion; and
    performing a bitwise OR on the left shifted resultant and the binary value to generate the offset.

11. The method of claim 9, wherein the step of generating the offset comprises:
    deriving a binary value of the third portion; and
    concatenating one bit ONE in front of the most significant bit (MSB) of the binary value to generate the offset.

12. The method of claim 11, wherein the step of deriving the binary value of the third portion comprises:
    deriving the binary value of the third portion based on the number of successive bit ONES in the second portion.

13. The method of claim 11, wherein the step of deriving the binary value of the third portion comprises:
    deriving the binary value of the third portion based on the number of successive bit ONES in the second portion and the order of Exp-Golomb when the order is not zero.

14. The method of claim 9, wherein the first portion of the codeword corresponds to a truncated unary prefix of the codeword which comprises a plurality of bits having the same polarity; and the second and third portions of the codeword correspond to a k-th order Exp-Golomb suffix of the codeword.

15. A method for generating a decoded value from a codeword which is binarized utilizing a concatenated unary/k-th order Exp-Golomb code, the method comprising:
    identifying a first portion of the codeword, a second portion of the codeword and a third portion of the codeword;
    generating an offset according to the first portion and second portion;
    decoding the third portion to generate an index value by treating the third portion as a binary number; and
    generating the decoded value by adding the offset and the index value.

16. The method of claim 15, wherein the step of generating the offset comprises:
    deriving a first value by deriving the number of successive bit ONES of the first portion and the second portion; and
    using the first value as the input of a look-up table to obtain the offset as the output of the look-up table.

17. The method of claim 15, wherein the offset is derived by left shifting value 1 according to the number of successive bit ONES of the second portion and adding the left shifted resultant to a predetermined value.

18. The method of claim 15, wherein the step of generating the offset comprises:
    deriving a left shifted resultant by left shifting value 1 according to the number of successive bit ONES of the second portion and the order of Exp-Golomb when the order is not zero; and
    adding the left shifted resultant to a predetermined value.

19. The method of claim 15, wherein the step of generating the offset comprises:
    using a concatenated pattern of the first portion and the second portion as the input of a look-up table to get the output of the look-up table as the offset.

20. The method of claim 15, wherein the first portion of the codeword corresponds to a truncated unary prefix of the codeword which comprises a plurality of bits having the same polarity; and the second and third portions of the codeword correspond to a k-th order Exp-Golomb suffix of the codeword.

* * * * *